(12) United States Patent
Arrington

(10) Patent No.: US 11,658,609 B2
(45) Date of Patent: May 23, 2023

(54) PHOTOVOLTAIC RENEWABLE ENERGY SYSTEM

(71) Applicant: Abron Arrington, Denver, CO (US)

(72) Inventor: Abron Arrington, Denver, CO (US)

( * ) Notice: Subject to any disclaimer, the term of this patent is extended or adjusted under 35 U.S.C. 154(b) by 148 days.

(21) Appl. No.: 17/072,426

(22) Filed: Oct. 16, 2020

(65) Prior Publication Data
US 2022/0085755 A1 Mar. 17, 2022

Related U.S. Application Data

(60) Provisional application No. 63/077,257, filed on Sep. 11, 2020.

(51) Int. Cl.
| | |
|---|---|
| *H02S 40/22* | (2014.01) |
| *H02S 40/38* | (2014.01) |
| *F21K 9/68* | (2016.01) |
| *F21L 4/02* | (2006.01) |
| *F21L 4/08* | (2006.01) |
| *H02N 11/00* | (2006.01) |
| *F21Y 115/10* | (2016.01) |

(52) U.S. Cl.
CPC ............... *H02S 40/22* (2014.12); *F21K 9/68* (2016.08); *F21L 4/027* (2013.01); *F21L 4/085* (2013.01); *H02N 11/008* (2013.01); *H02S 40/38* (2014.12); *F21Y 2115/10* (2016.08)

(58) Field of Classification Search
CPC ............... H01L 31/0586; H01L 31/055; H01L 31/02325; H01L 31/0522; H01L 31/0524; H01L 31/0525; H01L 31/028; H01L 31/0527; H01L 31/02327; H01L 31/047; H01L 31/054–056; F21S 9/037; H02S 40/32; H02S 40/20; H02S 40/22; G02G 2006/12157; G02B 6/2746; G02B 6/4295; G02F 1/0955; H02N 11/008
See application file for complete search history.

(56) References Cited

U.S. PATENT DOCUMENTS

| | | | |
|---|---|---|---|
| 5,110,368 A | 5/1992 | Otto et al. | |
| 7,862,198 B2 * | 1/2011 | Shyu | F21V 11/06 |
| | | | 362/217.02 |

(Continued)

FOREIGN PATENT DOCUMENTS

WO WO 2017-160704 A1 9/2017

OTHER PUBLICATIONS

International Search Report for PCT/US2020/066750.
Written Opinion for PCT/US2020/066750.

*Primary Examiner* — Ryan S Cannon
(74) *Attorney, Agent, or Firm* — Devlin Law Firm LLC

(57) ABSTRACT

A photovoltaic renewable energy system utilizes a light source and one or more reflectors to produce power via photovoltaic cells. An exemplary photovoltaic renewable energy system utilizes a light source, such as Light Emitting Diodes (LED), to provide light to photovoltaic cells that therein produce electrical power. The photovoltaic cells may be arranged in a photovoltaic array to ensure maximum power conversion from the incident light. A reflector, such as a prism may be used to direct light from the light source onto the photovoltaic cells. A cell reflector, which may also be a prism, may be configured proximal to the photovoltaic cell surfaces to reflect light onto the photovoltaic surface to increase power conversion.

12 Claims, 6 Drawing Sheets

(56) References Cited

U.S. PATENT DOCUMENTS

| | | | |
|---|---|---|---|
| 2005/0229964 A1* | 10/2005 | Liao | H01M 10/465 |
| | | | 136/252 |
| 2008/0289678 A1* | 11/2008 | Rouda | F21S 9/037 |
| | | | 136/243 |
| 2010/0096000 A1* | 4/2010 | Andrade | H01L 31/02021 |
| | | | 136/246 |
| 2012/0234373 A1* | 9/2012 | Colby | H01L 31/022425 |
| | | | 136/246 |
| 2016/0099362 A1 | 4/2016 | Bellette et al. | |
| 2021/0071844 A1* | 3/2021 | Chau | F21V 7/05 |
| 2022/0006424 A1* | 1/2022 | Whitwick | H01L 31/048 |

* cited by examiner

PHOTOVOLTAIC RENEWABLE ENERGY SYSTEM

CROSS REFERENCE TO RELATED APPLICATIONS

This application claims the benefit of priority to U.S. provisional application No. 63/077,257, filed on Sep. 11, 2020; the entirety of which is hereby incorporated by reference herein.

BACKGROUND OF THE INVENTION

Field of the Invention

The invention relates to a photovoltaic renewable energy system that utilizes a light source and one or more reflectors to produce power via photovoltaic cells.

Background

Photovoltaic cells are useful for producing power during daylight hours and this power can be stored in a battery for use during the night. There are many situations however wherein there is not enough power during the night and additional power is required.

SUMMARY OF THE INVENTION

The invention is directed to a photovoltaic renewable energy system that utilizes a light source and one or more reflectors to produce power via photovoltaic cells. An exemplary photovoltaic renewable energy system utilizes a light source, such as Light Emitting Diodes (LED), to provide light to photovoltaic cells that therein produce electrical power. The photovoltaic cells may be arranged in a photovoltaic array to ensure maximum power conversion from the incident light. An inlet reflector, such as a prism may be used to direct light from the light source onto the photovoltaic cells or into a light inlet to an array of photovoltaic cells. A cell reflector, which may also be a prism, may be configured proximal to the photovoltaic cell surfaces to reflect light onto the photovoltaic surface to increase power conversion.

A reflector may be a prism that diffracts light and may separate light into the components of light, wherein a white light may be broken into the various colors of visible light. Photovoltaic cells may operate more efficiently with exposure to certain wavelengths of light, such as red light having a wavelength of between about 635-700 nm. Visible light may range from 380 to 700 nm and span violet to red light. A reflector such as a prism or refractive element may filter out certain wavelengths of light or separate the light into various wavelengths, such as into red light while absorbing other wavelengths of light. A reflector may be doped with a dopant to diffract and/or absorb light or portions of light within wavelength ranges.

In an exemplary embodiment, a photovoltaic array comprises two planar photovoltaic cells arranged to form a light inlet therebetween. The two planar photovoltaic cells may be configured at a diverging angle to produce the light inlet and may create a light funnel that tapers from the light inlet down along the two photovoltaic cells. An inlet prism may be configured between the light source and the light inlet and a cell prism may be configured between the two planar and diverging photovoltaic cells. A housing around the photovoltaic cells may also include a reflective surface.

In another embodiment, a light source, such as a cylindrical light source is configured within a light inlet formed by photovoltaic cells that extend around the light source. The photovoltaic cell or cells may form a closed enclosure, such as a cylindrical enclosure around the light source. A reflector may be configured between the light source and the photovoltaic cells. A housing around the photovoltaic cells may also include a reflective surface.

An exemplary photovoltaic renewable energy system is a self-contained renewable energy system that may be used to provide electricity for a multitude of purposes including but not limited to cell phones, computers, consumer electronic appliances, automobiles, aircraft, boats, homes, commercial/industrial buildings, city, state, and national power plants and grids. The photovoltaic renewable energy system units may vary in size, shape and output depending upon its required use. In an exemplary embodiment, the photovoltaic renewable energy system is portable and has no dimension greater than 1 m, preferably no greater than 0.5 m and even more preferably no more than 0.25 m.

An exemplary photovoltaic renewable energy system may be a mini photovoltaic renewable energy system used to power smaller electronic devices, such as phones, computers and the like. A mini photovoltaic renewable energy system may have small dimensions of length, width and thickness of no more than about 25 mm, or no more than about 10 mm, or even no more than 5 mm. These dimensions may be of the housing configured around the photovoltaic renewable energy system.

The photovoltaic renewable energy system is unique in that it does not need to be recharged externally or require an external light to operate, such as sunlight. An exemplary photovoltaic renewable energy system is able to provide electricity continuously with an integral light source with little to no maintenance. As described herein, an exemplary photovoltaic renewable energy system employs a design that mounts photovoltaic cells/modules in an enclosure that may or be lined with reflective materials and is there after activated by battery powered LEDs that are aligned with paired prisms or lenses that direct the light to the photovoltaic cells, referred to herein as "photovoltaic lensing."

The photovoltaic renewable energy system may be designed for a wide variety of uses and as such a variety of photovoltaic cells may be used to suit the desired output and application. The prisms may be needed when transparent photovoltaic cells/modules are used. Photovoltaic cells in the form of photovoltaic paint may also be placed in a number of materials including directly on the surface of the prisms or lenses. An exemplary photovoltaic renewable energy system may be filled with a material, such as a resin or gels to mitigate vibrations, heat, and fire hazards.

The photovoltaic renewable energy system is designed to be compatible with external photovoltaic components such as, but not limited to breakers, DC combiner boxes, and DC disconnect boxes.

An optical prism is a transparent optical element with flat surfaces that refract light, wherein at least one surface must be an angled. An exemplary optical prism is a triangular prism having a triangular base and rectangular sides. A reflector or prism may have various shapes however, such as rectangular, wherein the top and bottom surfaces are planar and extend parallel with each other and rectangular in shape. A prisms is made from a material that is transparent to light produced by the light source, or at least a portion of the light and may be made of glass, plastic, or fluorite. A dispersive prism breaks up white light up into its constituent spectral colors. Furthermore, prisms can be used to reflect light, or to split light into components with different polarizations.

A flexible photovoltaic cell is configured on a flexible substrate whereby the photovoltaic cell or cells can bend and flex to conform to a desired shape, such as a cylinder, the substrate may a foil or film or fabric and may comprise metal, plastic, paper or composite materials, for example.

The summary of the invention is provided as a general introduction to some of the embodiments of the invention, and is not intended to be limiting. Additional example embodiments including variations and alternative configurations of the invention are provided herein.

BRIEF DESCRIPTION OF SEVERAL VIEWS OF THE DRAWINGS

The accompanying drawings are included to provide a further understanding of the invention and are incorporated in and constitute a part of this specification, illustrate embodiments of the invention, and together with the description serve to explain the principles of the invention.

Figure 1:
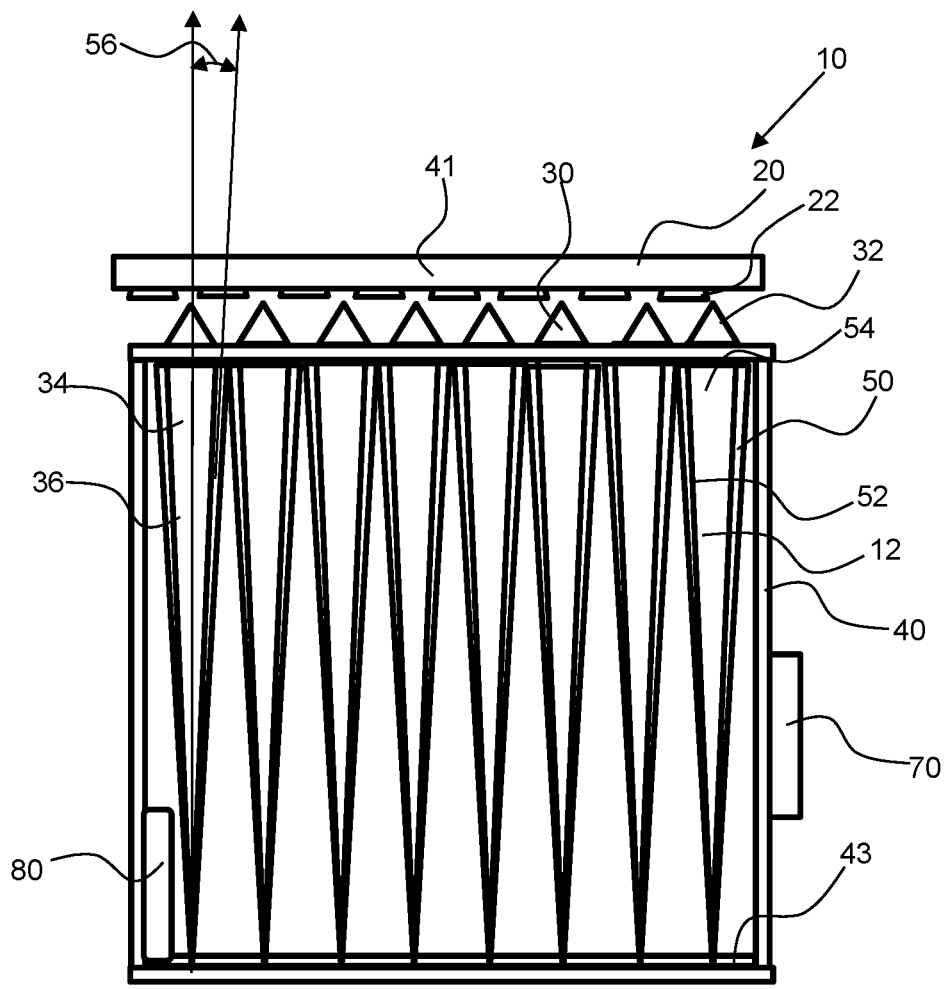
FIG. 1 shows a front view of an exemplary photovoltaic renewable energy system having photovoltaic cell arrays with pairs of planar photovoltaic cells configured at diverging angles to produce a light inlet and tapering light channel.
Figure 2:
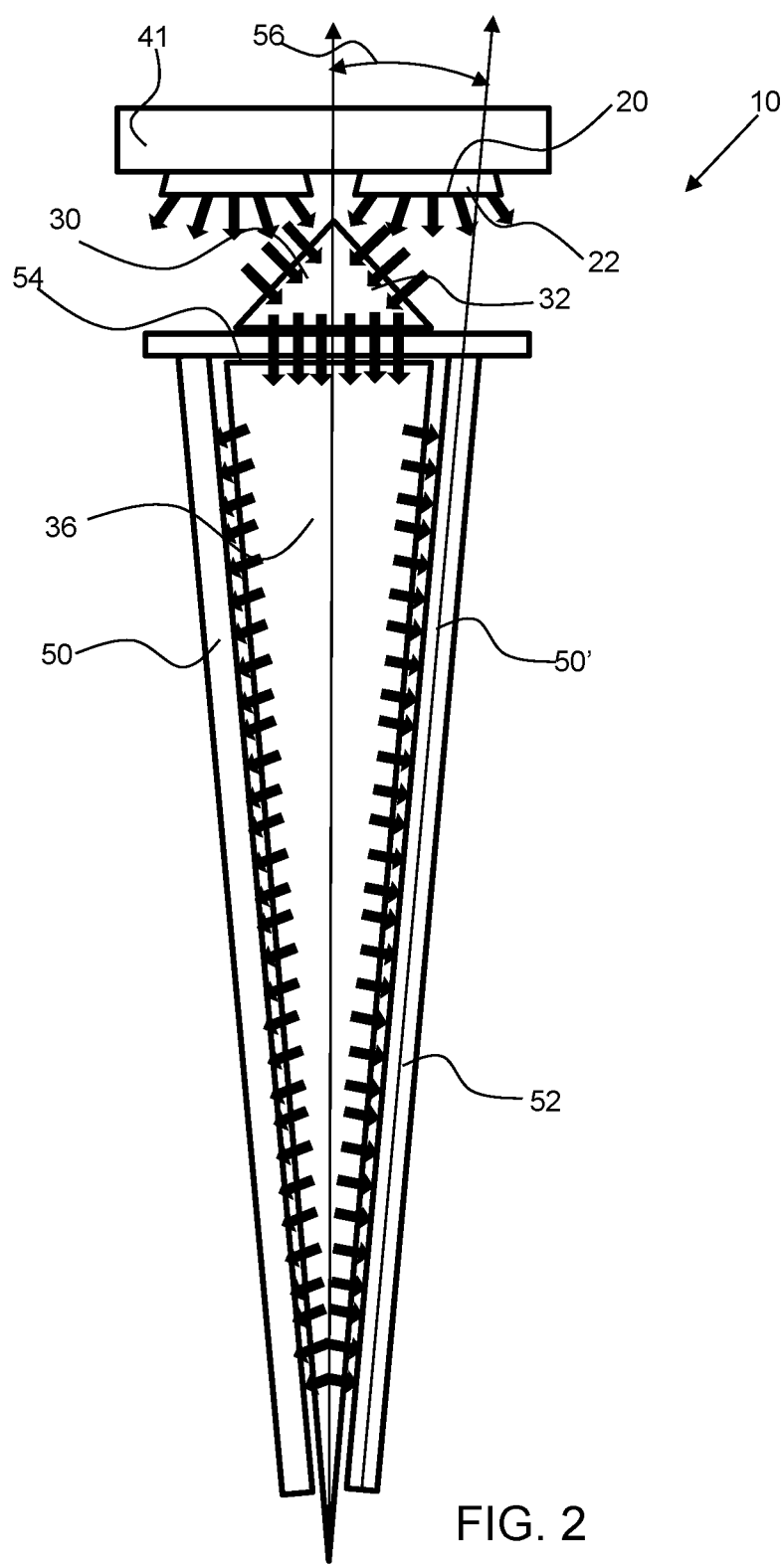
FIG. 2 shows a front enlarged view of an exemplary photovoltaic renewable energy system comprising a photovoltaic cell array with pairs of planar photovoltaic cells configured at diverging angles to produce a light inlet and tapering light channel.

Corresponding reference characters indicate corresponding parts throughout the several views of the figures. The figures represent an illustration of some of the embodiments of the present invention and are not to be construed as limiting the scope of the invention in any manner. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the present invention.

DETAILED DESCRIPTION OF THE ILLUSTRATED EMBODIMENTS

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Also, use of "a" or "an" are employed to describe elements and components described herein. This is done merely for convenience and to give a general sense of the scope of the invention. This description should be read to include one or at least one and the singular also includes the plural unless it is obvious that it is meant otherwise.

Certain exemplary embodiments of the present invention are described herein and are illustrated in the accompanying figures. The embodiments described are only for purposes of illustrating the present invention and should not be interpreted as limiting the scope of the invention. Other embodiments of the invention, and certain modifications, combinations and improvements of the described embodiments, will occur to those skilled in the art and all such alternate embodiments, combinations, modifications, improvements are within the scope of the present invention.

Referring to FIGS. 1 to 4, an exemplary photovoltaic renewable energy system 10 has photovoltaic cell arrays 52 of pairs of planar photovoltaic cells 50, 50' configured at diverging angles 56 to produce a light inlet 54 and tapering light channel. A light source 20, such as LED lights 22 are configured over the top of the photovoltaic cell housing 40. An inlet light reflector 30, such as an inlet prism 32 is configured between the light source and the light inlet 54 to the tapering light channel. A cell reflector 34, such as a cell prism 36 is configured between the two tapering photovoltaic cells in the cell array. In this way, light from the light source is directed down into the cell prism and the cell prism reflects light onto the photovoltaic cells, and may reflect it at an orthogonal angle to provide high efficiency. A controller 70 may be used to control the lights, such as when the light source is turned on and off as function of the battery charge, for example, changing the intensity or wattage applied to the lights and charging of a battery 80. The battery may be used for powering an electronic device.

Figure 3:
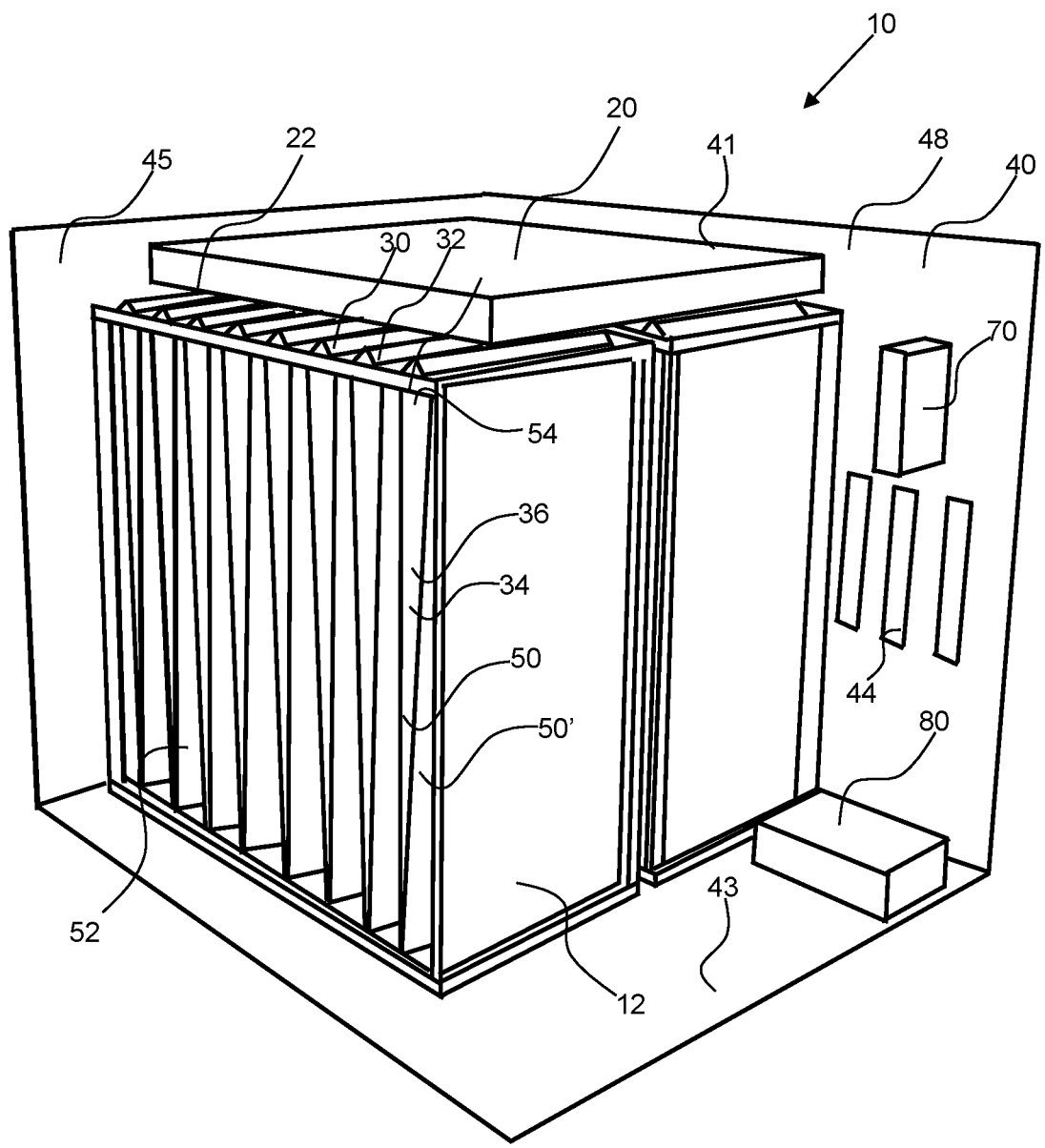
FIG. 3 shows a perspective view of an exemplary photovoltaic renewable energy system having photovoltaic cell arrays with pairs of planar photovoltaic cells configured at diverging angles to produce a light inlet and tapering light channel.
Figure 4:
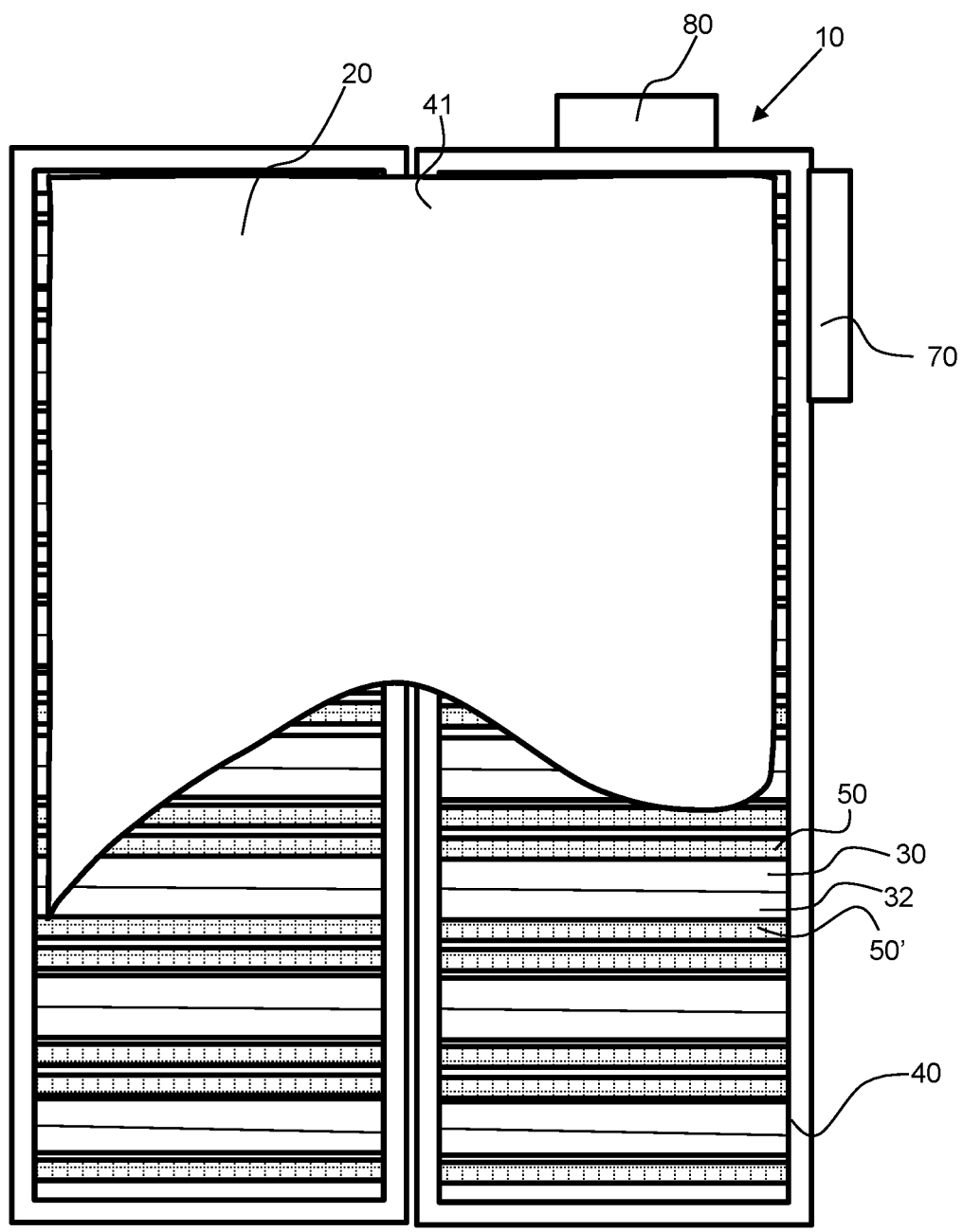
FIG. 4 shows a top view of an exemplary photovoltaic renewable energy system having photovoltaic cell arrays with pairs of planar photovoltaic cells configured at diverging angles to produce a light inlet and tapering light channel.

As shown in FIG. 3, the housing 40 may comprise reflective surfaces 48 on the interior of the housing to reflect light back into the energy converter assembly 12. The reflective surfaces may include one or more reflectors which may be a mirror, a reflective coating or paint, for example. The housing has perimeter walls 45 that extend around the energy converter 12, a housing cap 41 and a housing base 43. A housing may completely encapsulate the photovoltaic renewable energy system 10 or the energy conversion portion 12. Also, the housing may include housing light apertures 44 to emit light from the housing, whereby the photovoltaic renewable energy system 10 acts as a light source.

Figure 5:
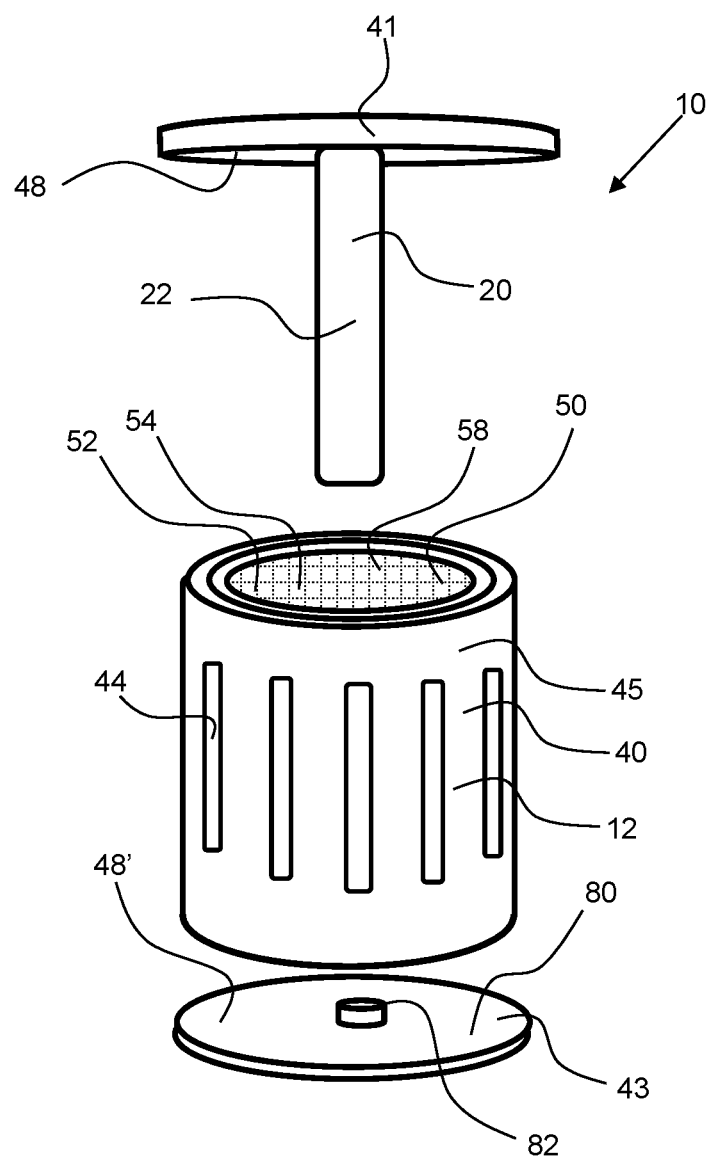
FIG. 5 shows a perspective view of an exemplary photovoltaic renewable energy system having photovoltaic cells configured around a light source.

Referring now to FIG. 5, an exemplary photovoltaic renewable energy system 10 has a photovoltaic cell or cells 50 configured around a light source, 20, such as a LED 22. The photovoltaic cell 50 may comprises a plurality of individual cells that are configured to form a light inlet 54 between the photovoltaic cells, such as a cylindrical shaped light inlet, or a closed light inlet, wherein photovoltaic cells are configured completely around the light inlet, as shown in FIG. 5. The photovoltaic cell may comprise a flexible photovoltaic cell 58 that is configured on a flexible substrate that can form an enclosure around the light source, such as a cylindrical enclosure. The light source is cylindrical in shape as well. A battery 80 is configured on an opposing end of the housing 40 from the light inlet 54 and may be configured to provide power to the light source. The battery contact 82 may be configured to contact the extended end of the light source to power the light source.

As shown in FIG. 3, the housing has a cylindrically shaped perimeter wall 45, a housing cap 41 that has the light source coupled thereto and a housing base 43 having a battery coupled thereto. The housing 40, such as the housing cap 41, the housing bottom 44 and perimeter wall 45 may have reflective surfaces 48, 48' to reflect light back into the energy converter 12. The housing also has a plurality of light apertures 44 to emit light from the housing, whereby the photovoltaic renewable energy system 10 acts as a light source. The photovoltaic cells may extend vertically between the light apertures to form a partial enclosure around the light source.

Figure 6:
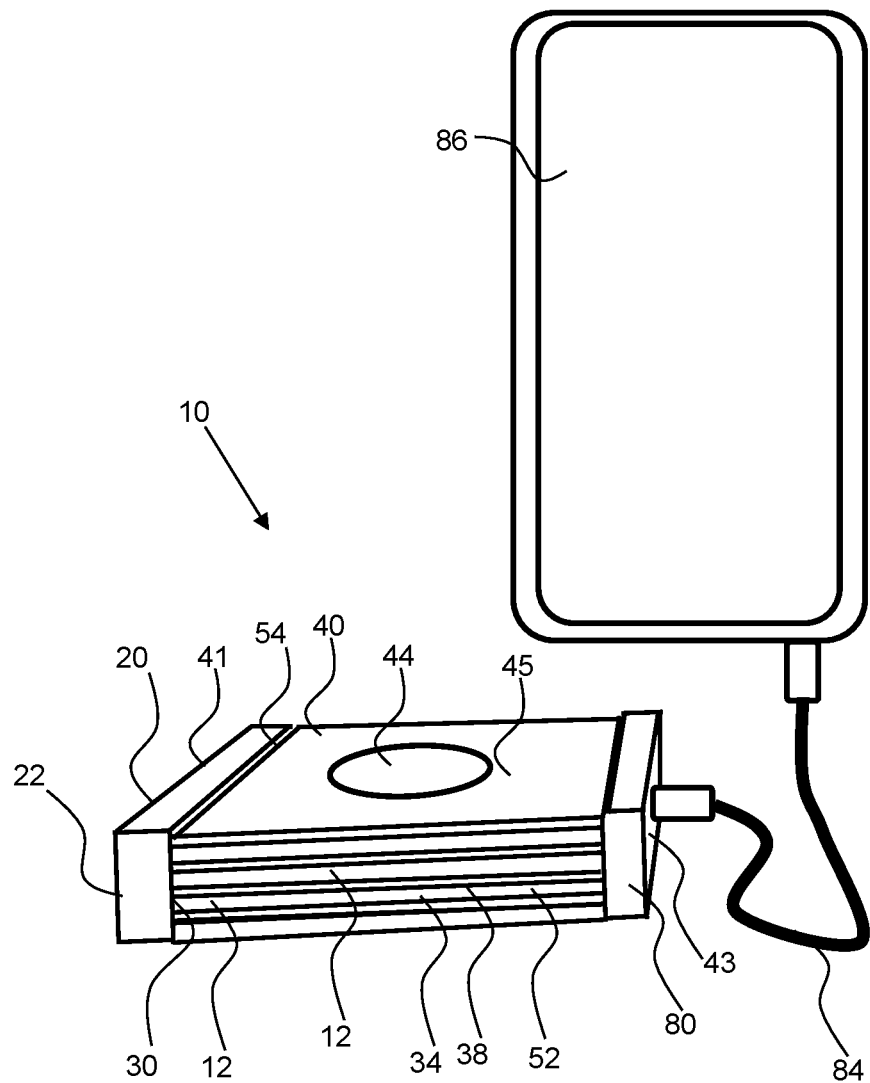
FIG. 6 shows a perspective view of an exemplary mini photovoltaic renewable energy system having photovoltaic cell arrays with pairs of planar photovoltaic cells configured at diverging angles to produce a light inlet and tapering light channel.

FIG. 6 shows a perspective view of an exemplary mini photovoltaic renewable energy system 10 having photovoltaic cell arrays with pairs of planar photovoltaic cells 50 configured at on either side of a refractive element 38, which may be a cell prism 36 or an element that refract light from the light inlet 54 outward onto the photovoltaic cells. A refractive element may have opposing planar surfaces extending along opposing photovoltaic cells, or the planar surfaces may be at an angle to one another to form a prism. The cell refractive element 38 may be a rectangular prism having rectangular top and bottom surfaces that are adjacent to the photovoltaic cells 50. As described herein, a mini photovoltaic renewable energy system 10 may have no dimension, length, width or thickness, or diameter of more than 25 mm. As shown, the mini photovoltaic renewable energy system is coupled to an electronic device 86, such as a mobile phone, by a charging cable 84 to charge the phone by the battery 80.

It will be apparent to those skilled in the art that various modifications, combinations and variations can be made in the present invention without departing from the scope of the invention. Specific embodiments, features and elements described herein may be modified, and/or combined in any suitable manner. Thus, it is intended that the present invention cover the modifications, combinations and variations of this invention provided they come within the scope of the appended claims and their equivalents.

What is claimed is:

1. A photovoltaic renewable energy system comprising:
    a) a light source that produces light;
    b) an energy converter comprising;
        i) a pair of planar photovoltaic cells configured at a diverging angle to each other to produce a light inlet and a tapering light channel between the pair of planar photovoltaic cells, wherein the pair of planar photovoltaic cells are configured to receive the light from the light source to produce electricity;
        ii) a battery configured to receive said electricity from the photovoltaic cells to charge said battery;
    c) an inlet prism configured between the light source and the light inlet to the pair of planar photovoltaic cells, wherein the inlet prism directs light from the light source into the light inlet;
        wherein the inlet prism is triangular in cross-sectional shape having a base that spans over the inlet;
        wherein the base of the inlet prism is a planar surface extending over the light inlet and wherein the light emitted from the base is directed directly down and
    d) a cell prism that is triangular in cross-sectional shape having three planar surfaces and tapering within the tapering light channel, wherein the cell prism is configured between the two planar photovoltaic cells and configured to receive light from the inlet prism and direct light into the planar photovoltaic cells;
        wherein one of the planar surfaces of the cell prism extends along the light inlet and is configured to receive light directed out from the planar surface of the base of the inlet prism; and
        wherein the cell prism is configured to direct light at an orthogonal angle to the planar photovoltaic cells.

2. The photovoltaic renewable energy system of claim 1, wherein the light source comprises light emitting diodes.

3. The photovoltaic renewable energy system of claim 1, comprising a plurality of pairs of planar photovoltaic cells, each pair of planar photovoltaic cells configured at a diverging angle to each other to produce a light inlet, and each comprising an inlet prism configured over the light inlet of each pair of planar photovoltaic cells and each pair of planar photovoltaic cells comprising a cell prism.

4. The photovoltaic renewable energy system of claim 3, further comprising a housing forming an enclosure around the energy converter.

5. The photovoltaic renewable energy system of claim 4, wherein the housing has reflective interior surfaces for reflecting light back into the energy converter.

6. The photovoltaic renewable energy system of claim 5, wherein the housing has light emitting apertures for emitting light from the housing.

7. The photovoltaic renewable energy system of claim 1, further comprising a controller that controls the lumens produced by the light source.

8. The photovoltaic renewable energy system of claim 7, wherein the controller controls when the light source is turned on.

9. The photovoltaic renewable energy system of claim 1, further comprising a housing forming an enclosure around the energy converter.

10. The photovoltaic renewable energy system of claim 9, wherein the housing has reflective interior surfaces for reflecting light back into the energy converter.

11. The photovoltaic renewable energy system of claim 10, wherein the housing has light emitting apertures for emitting light from the housing.

12. The photovoltaic renewable energy system of claim 1, further comprising a housing configured around the photovoltaic cells, and wherein the housing has light emitting apertures for emitting light from the housing.

* * * * *